United States Patent [19]

Yamaguchi et al.

[11] Patent Number: 5,246,526

[45] Date of Patent: Sep. 21, 1993

[54] SURFACE TREATMENT APPARATUS

[75] Inventors: Sumio Yamaguchi; Akio Inada, both of Tokyo; Kenichi Kawasumi, Ome, all of Japan

[73] Assignee: Hitachi, Ltd., Tokyo, Japan

[21] Appl. No.: 908,913

[22] Filed: Jul. 2, 1992

Related U.S. Application Data

[63] Continuation of Ser. No. 544,600, Jun. 27, 1990, abandoned.

[30] Foreign Application Priority Data

Jun. 29, 1989 [JP] Japan .................................. 1-165461

[51] Int. Cl.$^5$ ............................................. H01L 21/00
[52] U.S. Cl. ................................... 156/345; 156/643;
156/659.1; 156/626; 156/668; 118/722;
118/723
[58] Field of Search ............ 156/626, 643, 345, 659.1,
156/627; 118/723, 722; 4/668; 204/192.33,
192.32

[56] References Cited

U.S. PATENT DOCUMENTS

| | | | |
|---|---|---|---|
| 3,664,899 | 5/1972 | Wright et al. | 156/657 |
| 3,890,176 | 6/1975 | Bolon | 156/8 |
| 4,579,618 | 4/1986 | Celestine et al. | 156/345 |
| 4,614,639 | 9/1986 | Hegedus | 156/345 |
| 4,647,338 | 3/1987 | Visser | 204/192.32 |
| 4,687,544 | 8/1987 | Bersin | 156/643 |
| 4,801,352 | 1/1989 | Piwczyk | 156/345 |
| 4,885,047 | 12/1989 | Ury et al. | 156/345 |
| 4,936,940 | 6/1990 | Kawasumi et al. | 156/662 |

FOREIGN PATENT DOCUMENTS 63-70427 3/1988 Japan .
63-260034 10/1988 Japan .

OTHER PUBLICATIONS

IBM Technical Disclosure Bulletin; vol. 20; No. 11B; Apr. 1978; –Daley et al., p. 4802.

Primary Examiner—Brian E. Hearn
Assistant Examiner—George Goudreau
Attorney, Agent, or Firm—Fay, Sharpe, Beall, Fagan, Minnich & McKee

[57] ABSTRACT

In a surface treatment apparatus, an organic substance is removed through ashing by ultraviolet rays and ozone at atmospheric pressure. A transparent partition plate is provided in closely spaced, opposed relation to a material to be treated, and at least one gas outlet is open to that surface of the partition plate opposed to the material to be treated. With this arrangement, the gas can be directly collected via the gas outlet during the treatment, and the end point of the organic substance removal treatment can be detected by analyzing the collected gas.

25 Claims, 2 Drawing Sheets

SURFACE TREATMENT APPARATUS

This application is a continuation of application Ser. No. 07/544,600, filed Jun. 27, 1990, now abandoned.

BACKGROUND OF THE INVENTION

This invention relates generally to a surface treatment apparatus, and more particularly to a surface treatment apparatus capable of detecting the condition of removal of an organic substance, such as a resist, from a wafer of a semiconductor.

In the process of manufacturing a semiconductor, an organic resist film, such as a photoresist, is used as a mask. In order to remove the unnecessary organic resist film after the etching and the doping are carried out, instead of a wet process using an oxidation liquid, there has extensively been used a dry process in which the oxygen atoms in the atmosphere are activated by a plasma, thereby removing the resist film through oxidation. In such a plasma process, a semi-conductor device is exposed to the plasma, and due to a charge-up by the plasma, the semiconductor device is subjected to damage. Therefore, in order to keep such damage to a minimum, it is essential to detect the end point of the organic substance removal treatment, and for this purpose there has been employed a method for detecting gas as disclosed in Japanese Patent Unexamined Publication No. 63-70427.

In such prior art, the removal of an organic substance is carried out in a vacuum chamber, and therefore gas other than the gases related to the removal treatment will not be introduced into the vacuum chamber. Ultraviolet rays/ozone asher (disclosed, for example, in U.S. Pat. No. 3,890,176), in which the removal of organic substances is carried out below the atmospheric pressure, is much more effective than the above prior art. However, since a treatment chamber is not air-tight, the air intrudes into the treatment chamber from the exterior. Therefore, it has been difficult to analyze a change in the gas concentration related to the removal treatment, and for this reason such a process has not been performed.

SUMMARY OF THE INVENTION

It is therefore an object of this invention to provide a surface treatment apparatus which can detect a change in gas concentration during an organic substance removal treatment, even with respect to an asher which effects the organic substance removal treatment at the atmospheric pressure.

According to the present invention, there is provided a surface treatment apparatus comprising:

(a) a treatment chamber capable of being evacuated;

(b) a stage mounted within said treatment chamber so as to support thereon a material to be treated;

(c) a partition plate disposed in opposed relation to said stage to form a treatment space within said treatment chamber, said partition plate being spaced a predetermined distance from a surface of said material to be treated, said partition plate being made of a material capable of allowing ultraviolet rays to transmit therethrough;

(d) gas inlet means mounted on said partition plate so as to supply to said treatment space a reaction gas containing oxygen;

(e) an ultraviolet ray source for generating ultraviolet rays for exciting the oxygen in said reaction gas to produce excited oxygen atoms, said ultraviolet ray source being provided on that side of said partition plate opposite to said material to be treated, and said excited oxygen atoms reacting with an organic substance present on the surface of said material to be treated to produce gas in said treatment space; and (f) gas outlet means mounted on said partition plate so as to collect said gas, produced in said treatment space, for analysis purposes.

With the above construction, the gas can be directly collected through the gas outlet means during the treatment, and therefore the end point of the organic substance removal treatment can be detected by analyzing this gas.

DESCRIPTION OF THE PREFERRED EMBODIMENTS OF THE INVENTION

First, the principle of the present invention will now be described. Only a reaction gas, fed from a gas inlet means, and gas (production gas) produced from the surface of a material (treatment material) to be treated are filled in a treatment space formed between the treatment material and a partition plate disposed in closely spaced, opposed relation to the treatment material. These gases flow from the periphery of the treatment material. Therefore, if a gas outlet means is provided on part of the partition plate, the reaction gas and the production gas, filled in the treatment space between the surface of the treatment material and the partition plate, also flow into the gas outlet means. Therefore, when gas is collected from the gas outlet means, there is no possibility that a gas other than the reaction gas and the production gas will be included in such collected gas. Thus, only the gases related to the treatment reaction are present in the gas outlet means. More specifically, by providing a gas detection means for a pipe connected to the gas outlet means, the end point of the removal treatment can be detected by analyzing the collected gas using the gas detection means.

In a modified form of the invention, in addition to the a gas outlet means, gas inlet means is provided on that surface of the partition plate opposed to the treatment material. A gas flow rate control means is provided on a pipe connected to the gas inlet means, so as to control the flow rate of the incoming reaction gas. A gas detection means is provided on the pipe connected to the gas outlet means. With this arrangement, the collected gas is analyzed for comparison, and the end point of the removal treatment can be detected.

In another modified form of the invention, respective gas detection means are provided on the pipes connected respectively to the gas outlet means and to the gas inlet means. The results of the detections by the two detection means are compared with each other, thereby accurately detecting the end point of the organic substance removal treatment.

Figure 1:
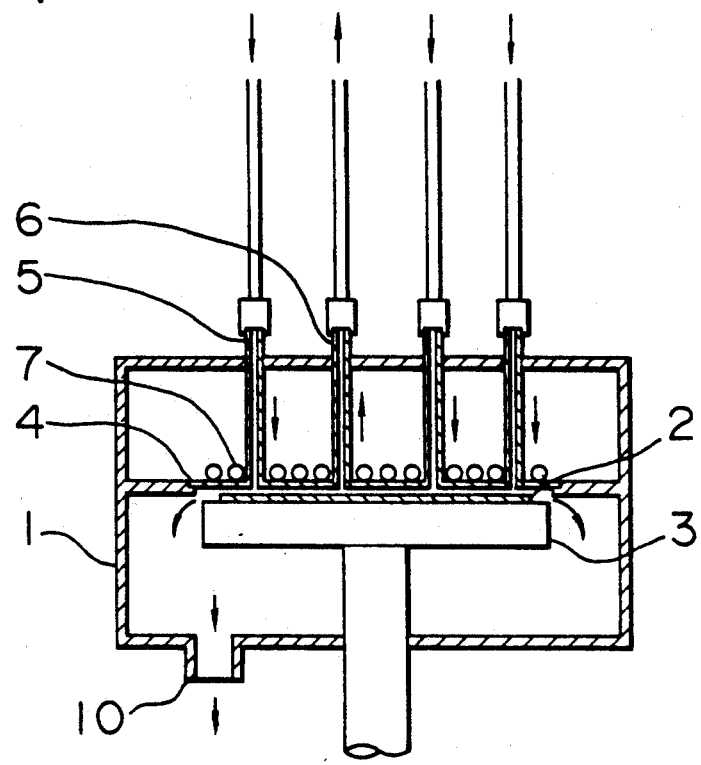
FIG. 1 is a schematic view of a first embodiment of a surface treatment apparatus of the present invention.

Specific embodiments of the invention will now be described with reference to the drawings in which identical reference numerals denote corresponding or the same parts, respectively. FIG. 1 shows a first embodiment of a surface treatment apparatus (organic substance removal apparatus) of the present invention. A process for manufacturing a semiconductor device includes a step of removing a resist film. One method of carrying out this step is to remove the organic resist film using ultraviolet rays and ozone below atmospheric pressure (see the above-mentioned U.S. patent). Ozone is supplied as a reaction gas, and the ozone is converted by ultraviolet rays into active oxygen atoms (excited oxygen atoms) and then is reacted with a resist coated on a wafer or a mask to decompose and vaporize the same into carbon dioxide, water, etc., which are discharged. Generally, to promote the reaction, there is provided a heating mechanism for increasing the temperature of the material to be treated.

The surface treatment apparatus shown in FIG. 1 comprises a treatment chamber 1 which is at atmospheric pressure, a stage 3 containing a heater and mounted within the treatment chamber 1 so as to support a wafer 2 thereon and to heat the same, a partition plate 4 of a synthetic quartz having a thickness of 25 mm and mounted within the treatment chamber 1 which partition plate causes a reaction gas, such as oxygen-containing gas (e.g. ozone; $O_3$ concentration: 100 g/nm$^3$; flow rate of ozone: l/min.), to effectively flow over the surface of the wafer 2, and allows ultraviolet rays to transmit therethrough, gas inlet members 5 for supplying the ozone gas, at least one gas outlet member 6 for discharging a gas (production gas) produced as a result of the reaction, and four ultraviolet lamps 7 for emitting ultraviolet rays mainly of 254 nm wavelength. The lamp 7 is composed of a W-shaped tube having a lamp voltage of 130 V, a lamp current of 1.16 A and a lamp power of 140 W. The gas outlet member 6 is open to the surface of the stage 3 on which the wafer 2 is placed.

The wafer 2 coated with a resist is heated to 150° C. to 300° C., and the ozone is supplied via the gas inlet members 5 mounted on the partition plate 4. The ozone flows through a gap (which preferably does not exceed 0.5 mm) between the wafer 2 and the partition plate 4 and is introduced into the treatment chamber 1 as indicated by arrows. The ozone is converted by the ultraviolet lamps 7, mounted on the partition plate 4, into active oxygen atoms (radical oxygen), and decomposes the resist into carbon dioxide, water, etc., to feed the same to a lower portion of the vacuum chamber 1. The gas thus fed to the lower portion of the vacuum chamber 1 is led to a ventilation duct 10 at a pressure of about −30 mmHg. At the same time, the same gas is discharged from the treatment chamber 1 via the gas outlet member 6 mounted on the partition plate 4. This discharge gas consisting of the reaction gas and the production gas is collected, and thus only the reaction gas and the production gas can be analyzed.

Figure 2:
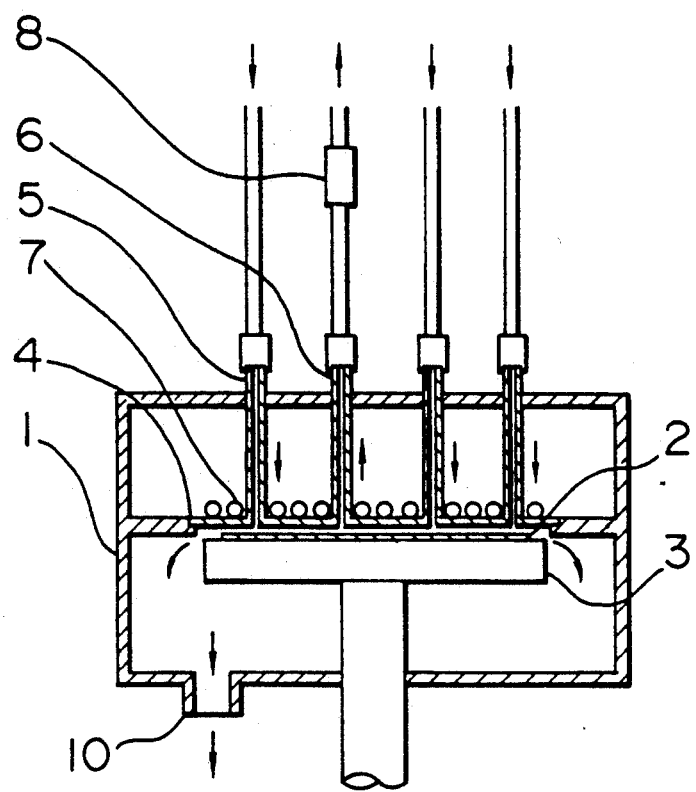
FIGS. 2 to 4 are views similar to FIG. 1, but showing second to fourth embodiments of the invention, respectively.

FIG. 2 shows a second embodiment of the invention. The construction within a treatment chamber 1 of this embodiment is the same as that of the first embodiment of FIG. 1, and a gas detection means 8 is provided on a pipe connected to a gas outlet member 6 provided on a partition plate 4. The gas detection means 8 is, for example, a $CO_2$ detector of the infrared absorption gas analysis type. As described above for the first embodiment, only the reaction gas and the production gas, which are present in the treatment space between the partition plate 4 and the wafer 2, are discharged into the gas outlet member 6 provided on the partition plate 4. Therefore, the end point (i.e., the time when the $CO_2$ concentration reaches a predetermined level) of the removal treatment can be detected by analyzing the discharge gas by the gas detection means 8 and by monitoring the gas concentration.

Figure 3:
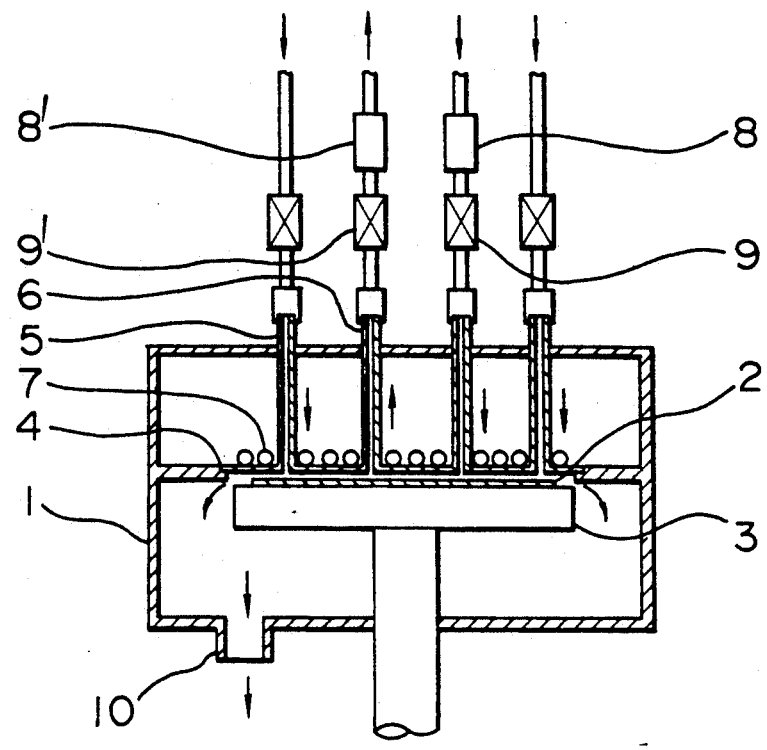

FIG. 3 shows a third embodiment of the invention. The construction within a treatment chamber 1 of this embodiment is the same as that of the first embodiment of FIG. 1. In this embodiment, at least one (three in the drawings) gas inlet member 5 and at least one gas outlet member 6 are mounted on a partition plate 4, and are directed toward a wafer 2, and gas flow rate control means 9 and 9', which may be needle valves, are provided respectively on pipes connected respectively to the gas inlet members 5 and the gas outlet member 6. Also, gas detection means 8 and 8' are provided respectively on the pipes connected respectively to the gas inlet member 5 and the gas outlet member 6. With this arrangement, by comparing the gas analysis results before the reaction with the gas analysis results after the reaction through the gas detection means 8 and 8', the end point of the organic substance removal treatment can be detected accurately.

Figure 4:
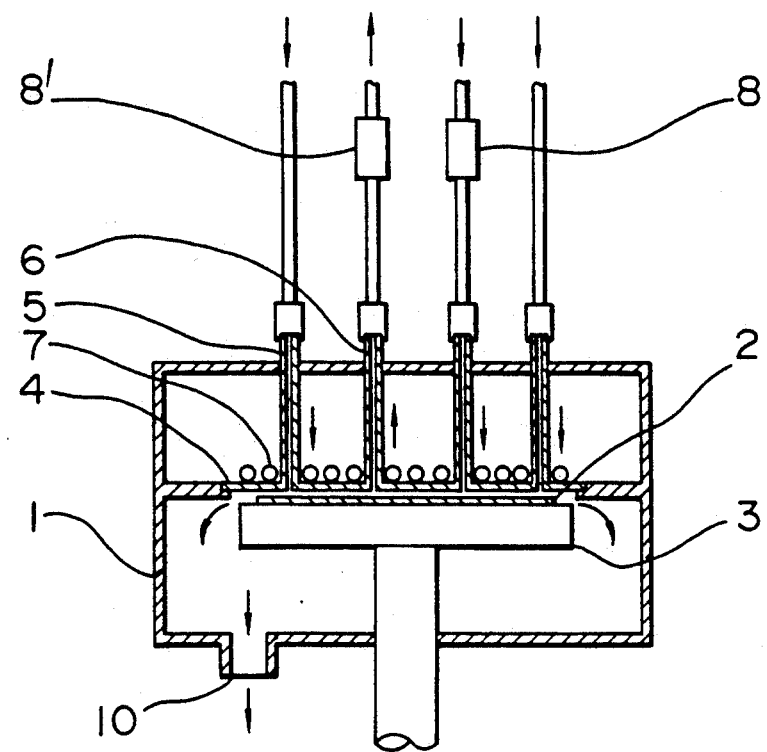

FIG. 4 shows a third embodiment of the invention. The construction within a treatment chamber 1 of this embodiment is the same as that of the first embodiment of FIG. 1. In this embodiment, at least one (three in the drawings) gas inlet member 5 and at least one gas outlet member 6 are provided on a partition plate 4, and are directed toward a wafer 2, and gas detection means 8 and 8' are provided respectively on pipes connected respectively to the gas inlet member 5 and the gas outlet member 6. With this arrangement, the gas analysis before the reaction is effected by the gas detection means 8, and the gas analysis after the reaction is effected by the gas detection means 8', and by comparing these two analysis results (before the reaction: $N_2$, $O_2$, Ar, $CO_2$, etc.; after the reaction: $O_2$, $O_3$, $H_2O$ with each other, the end point of the organic substance removal treatment can be detected accurately.

What is claimed is:

1. An apparatus for removing an organic substance from a substance to be treated, comprising:
   stage means for supporting a substrate to be treated, said substrate having an organic substance on one side thereof;
   partition plate means for forming a space of a predetermined distance between said partition plate means and said stage means;
   means for supplying to said space a gas containing ozone;
   a treatment chamber having said stage means and said partition plate means located therein, said treatment chamber being internally exposed to atmospheric pressure;
   means for discharging production gas from said space from a relatively outer periphery thereof, the production gas being produced in said space by reaction of the ozone of the ozone-containing gas with the organic substance; and
   means for detecting a substantial end point of organic substance removal based upon concentration of the production gas, said detecting means including means for collecting production gas removed from said space at an inner portion thereof relative to said outer periphery, and means for detecting and concentration of the collected production gas.

2. The apparatus according to claim 1, further comprising an ultraviolet ray source provided opposite to said stage means with said partition plate means interposed between said ultraviolet ray source and said stage means.

3. The apparatus according to claim 2, wherein said ultraviolet ray source comprises at least one ultraviolet lamp.

4. The apparatus according to claim 1, further comprising means provided in said stage means for heating the material to be treated.

5. The apparatus according to claim 4, wherein said heating means includes means for controlling heating to the material to be treated within a range of 150° C. to 300° C.

6. The apparatus according to claim 1, wherein said production gas concentration detecting means comprises means for detecting decrement of concentration of $CO_2$ in the production gas to less than a predetermined level.

7. The apparatus according to claim 1, wherein said end point detecting means includes at least one pipe through which the production gas in said space is collected and introduced to said gas concentration detecting means.

8. The apparatus according to claim 7, further comprising means provided in said pipe for controlling flow rate of the production gas.

9. The apparatus according to claim 1, wherein the predetermined distance is less than or equal to substantially 0.5 mm.

10. The apparatus according to claim 1, wherein said treatment chamber is a non-airtight structure for allowing ambient air to enter said treatment chamber from outside the treatment chamber during reaction of the ozone with the organic substance.

11. The apparatus according to claim 1, wherein said partition plate means includes a quartz material.

12. The apparatus according to claim 1, wherein said gas supplying means comprises at least one pipe.

13. The apparatus according to claim 12, further comprising means provided in said pipe for controlling flow rate of the reactive gas.

14. An apparatus for removing an organic substance from a substance to be treated, comprising:
stage means for supporting a substrate to be treated, said substrate having an organic substance on one side thereof;
partition plate means for forming a space of a predetermined distance between said partition plate means and said stage means;
means for supplying to said space a gas containing ozone;
means for discharging production gas from said space from a relatively outer periphery thereof, the production gas being produced in said space by reaction of the ozone of the ozone-containing gas with the organic substance; and
means for detecting a substantial end point of organic substance removal based upon concentration of the production gas, said detecting means including means for collecting production gas removed from said space at an inner portion thereof relative to said outer periphery, and means for detecting and concentration of the collected production gas, said end point detecting means being arranged to receive the production gas out of said space from at least one upper portion thereof separately from said discharging means.

15. The apparatus according to claim 14, further comprising an ultraviolet ray source provided opposite to said stage means with said partition plate means interposed between said ultraviolet ray source and said stage means.

16. The apparatus according to claim 15, wherein said ultraviolet ray source comprises at least one ultraviolet lamp.

17. The apparatus according to claim 14, wherein said gas supplying means comprises at least one pipe.

18. The apparatus according to claim 17, further comprising means provided in said pipe for controlling flow rate of the reactive gas.

19. The apparatus according to claim 14, wherein said gas concentration detecting means comprises means for detecting decrement of concentration of $CO_2$ in the production gas to less than a predetermined level.

20. The apparatus according to claim 14, wherein said partition plate means includes a quartz material.

21. The apparatus according to claim 14, wherein the predetermined distance is less than or equal to 0.5 mm.

22. The apparatus according to claim 14, wherein said end point detecting means includes at least one pipe through which the production gas in said space is received.

23. The apparatus according to claim 22, further comprising means provided in said pipe for controlling flow rate of the production gas.

24. The apparatus according to claim 14, further comprising means provided in said stage means for heating the material to be treated.

25. The apparatus according to claim 24, wherein said heating means includes means for controlling heating of the material to be treated within a range of 150° C. to 300° C.

* * * * *